US012288975B2

(12) United States Patent
Tseng et al.

(10) Patent No.: US 12,288,975 B2
(45) Date of Patent: Apr. 29, 2025

(54) ELECTRONIC DEVICE INCLUDING DRIVER CIRCUIT AND DRIVING METHOD THEREOF

(71) Applicant: Innolux Corporation, Miao-Li County (TW)

(72) Inventors: Ming-Chun Tseng, Miao-Li County (TW); Min-Hsin Lo, Miao-Li County (TW); Hung-Sheng Liao, Miao-Li County (TW); Chi-Lun Kao, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 269 days.

(21) Appl. No.: 17/750,415

(22) Filed: May 23, 2022

(65) Prior Publication Data

US 2022/0416534 A1  Dec. 29, 2022

Related U.S. Application Data

(60) Provisional application No. 63/242,041, filed on Sep. 9, 2021, provisional application No. 63/213,697, filed on Jun. 23, 2021.

(30) Foreign Application Priority Data

Mar. 10, 2022  (CN) .......................... 202210237941.1

(51) Int. Cl.
*H02H 7/20* (2006.01)
*H03K 3/012* (2006.01)

(52) U.S. Cl.
CPC ............... *H02H 7/20* (2013.01); *H03K 3/012* (2013.01)

(58) Field of Classification Search
CPC ............ H02H 7/20; H02H 3/243; H02H 3/10; H03K 3/012; G09G 2330/025;
(Continued)

(56) References Cited

U.S. PATENT DOCUMENTS

2015/0042229 A1* 2/2015 Duan .................... H05B 45/397
315/307
2020/0136601 A1* 4/2020 Liu ....................... H03K 17/082

FOREIGN PATENT DOCUMENTS

CN  108766353  11/2018
CN  110689840  1/2020
(Continued)

OTHER PUBLICATIONS

"Office Action of Taiwan Counterpart Application", issued on Mar. 21, 2023, p. 1-p. 4.
(Continued)

*Primary Examiner* — Premal R Patel
(74) *Attorney, Agent, or Firm* — JCIPRNET

(57) ABSTRACT

The disclosure provides an electronic device including a driver circuit and a driving method thereof. The driver circuit includes an electronic unit, a driver unit, and a detection and protection circuit. The driver unit is electrically connected to the electronic unit. The detection and protection circuit is electrically connected to the electronic unit through a first node, and is electrically connected to a gate terminal of the driver unit through a second node. When a voltage of the first node is pulled down, the detection and protection circuit controls the driver unit to be turned off. The detection and protection circuit of the driver circuit of the disclosure protects the electronic unit from excessive current.

19 Claims, 12 Drawing Sheets

(58) Field of Classification Search
CPC .... G09G 2330/04; G09G 3/3426; G09G 3/32; H05B 45/50; H05B 45/60
See application file for complete search history.

(56) References Cited

FOREIGN PATENT DOCUMENTS

| | | |
|---|---|---|
| TW | 201230878 | 7/2012 |
| TW | 202029162 | 8/2020 |

OTHER PUBLICATIONS

"Office Action of China Counterpart Application", issued on Jul. 29, 2024, p. 1-p. 7.

* cited by examiner

ELECTRONIC DEVICE INCLUDING DRIVER CIRCUIT AND DRIVING METHOD THEREOF

CROSS-REFERENCE TO RELATED APPLICATION

This application claims the priority benefits of U.S. provisional application Ser. No. 63/213,697, filed on Jun. 23, 2021 and 63/242,041, filed on Sep. 9, 2021, and Chinese application serial no. 202210237941.1, filed on Mar. 10, 2022. The entirety of each of the above-mentioned patent applications is hereby incorporated by reference herein and made a part of this specification.

BACKGROUND

Technical Field

The disclosure relates to an electronic device, and in particular to a driver circuit including a detection and protection circuit and a driving method thereof.

Description of Related Art

Driver circuits that are generally used to drive display panels or backlight panels, such as those used to drive active-matrix organic light emitting diode (AMLED), do not have a current detection function. When electronic units such as light emitting units or other electronic components are short-circuited or damaged, the current passing through may rise sharply, resulting in increased power consumption and risk of overheating and burning of electronic units. In view of this, in order to quickly disconnect the power supply source to protect the electronic unit from excessive currents, the following solutions are proposed for several embodiments.

SUMMARY

The disclosure provides an electronic device including a driver circuit and a driving method thereof, capable of detecting a voltage passing through an electronic unit and protecting the electronic unit from excessive current.

According to an embodiment of the disclosure, the electronic device of the disclosure includes a driver circuit, and the driver circuit includes an electronic unit, a driver unit, and a detection and protection circuit. The driver unit is electrically connected to the electronic unit.

The detection and protection circuit is electrically connected to the electronic unit through the first node, and is electrically connected to a gate terminal of the driver unit through the second node. When a voltage of the first node is pulled down, the detection and protection circuit controls the driver unit to be turned off.

According to an embodiment of the disclosure, the driving method of the driver circuit of the disclosure includes the following. A reset voltage is supplied to the first node during a reset period through the detection and protection circuit. A voltage of the first node is detected during a scanning period through the detection and protection circuit. When the voltage of the first node is pulled down, the detection and protection circuit controls the driver unit to be turned off.

Based on the above, the driver circuit of the disclosure may be electrically connected to the electronic unit through the first node and electrically connected to the gate terminal of the driver unit through the second node through the detection and protection circuit, respectively. When the detection and protection circuit determines that the voltage of the first node is pulled down, the driver unit may be controlled to be turned off. In this way, power supply to the electronic unit may be stopped immediately to protect the electronic unit from excessive current.

The disclosure can be understood by referring to the following detailed description in conjunction with the accompanying drawings. It should be noted that for the reader's ease of understanding and for the sake of simplicity of the accompanying drawings, many of the accompanying drawings in this disclosure show only a portion of the electronic device, and specific components in the accompanying drawings are not drawn to actual scale. In addition, the number and dimensions of the components in the drawings are for illustrative purposes only and are not intended to limit the scope of this disclosure.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Certain terms are used throughout this disclosure and in the claims to refer to specific components. Those skilled in the art should understand that electronic device manufacturers may refer to the same components by different names. This document does not intend to distinguish between components that have the same function but different names. In the following description and claims, the terms "include" and "comprise" are open-ended terms and should therefore be interpreted to mean "includes but is not limited to . . . ".

In some embodiments of the disclosure, terms such as "couple", "interconnect", etc., unless specifically defined, may refer to two structures in direct contact, or may refer to two structures that are not in direct contact, where other structures are located between the two structures. The term "couple" also includes the case where both structures are movable, or where both structures are fixed. In addition, the term "couple" includes any direct and indirect electrical means of connection.

The use of sequential numbers such as "first", "second" and other words used to modify the components in the specification and claims does not in itself imply and represent that the components have any previous sequential numbers, nor does it represent the sequence of a component and another component, or the sequence of manufacturing methods. The use of multiple sequential numbers is only used to enable a component with a certain name and another component with the same name to make a clear distinction. The same words may not be used in the claim and the specification, whereby the first component in the specification may be the second component in the claim. It should be noted that the following embodiments can substitute, reorganize, and mix technical features from several different embodiments to complete other embodiments without departing from the spirit of this disclosure.

Figure 1:
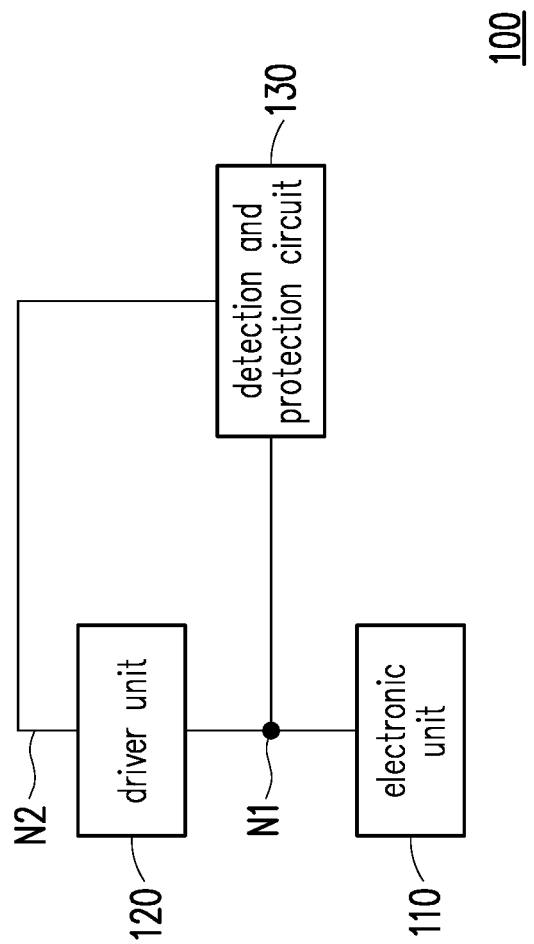
FIG. 1 is a circuit block diagram of a driver circuit according to an embodiment of the disclosure.

FIG. 1 is a circuit block diagram of a driver circuit 100 according to an embodiment of the disclosure. In the embodiment shown in FIG. 1, the driver circuit 100 includes an electronic unit 110, a driver unit 120, and a detection and protection circuit 130. According to design requirements, in some embodiments, the electronic unit 110 may include one or more light emitting units or other electronic components, and the number and arrangement thereof may be determined according to actual requirements. According to actual applications, the one or more light emitting units may include light emitting diode (LED), micro light emitting diode (micro-LED), organic light emitting diode (OLED), inorganic light emitting diode (ILED), mini light emitting diode (mini-LED), Micro-LED, electroluminescence (EL) component, laser diode, or other types of light emitting components, and this embodiment is not limited thereto.

In this embodiment, the driver unit 120 is electrically connected to the electronic unit 110, and the driver unit 120 may turn on or turn off a voltage or current signal for driving the electronic unit 110. The detection and protection circuit 130 is electrically connected to the electronic unit 110 through a node N1 (a first node), and is electrically connected to a gate terminal (a control end) of the driver unit 120 through a node N2 (a second node). The detection and protection circuit 130 may detect whether a voltage change (e.g., voltage pull-down) occurs in the first node N1 to determine whether the electronic unit 110 is short-circuited or damaged, etc. When a voltage of the first node N1 is pulled down, the detection and protection circuit 130 may control the driver unit 120 to be turned off. For example, the second node N2 controls the driver unit 120 to be turned off to stop the power supply to the electronic unit 110, thereby protecting the electronic unit 110 from excessive current.

Figure 2:
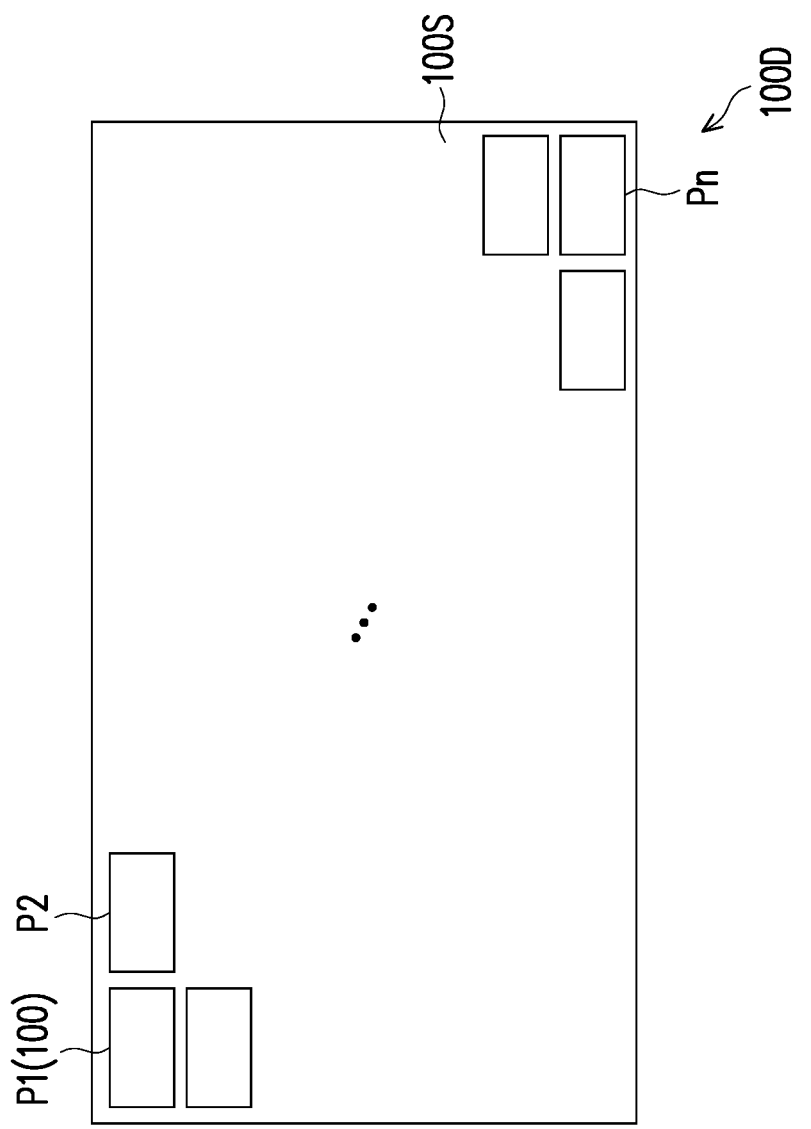
FIG. 2 is a schematic diagram of an implementation situation of a driver circuit according to an embodiment of the disclosure.

FIG. 2 is a schematic diagram of an implementation situation of a driver circuit 100D according to an embodiment of the disclosure. In the embodiment shown in FIG. 2, one or more driver circuits P1, P2, . . . , Pn may be disposed in any electronic device 100D. In some embodiments, the electronic device 100D may include multiple driver circuits P1 to Pn. The driver circuits P1 to Pn may be disposed on a substrate to form a substrate module 100S. The driver circuits P1 to Pn may be disposed in a matrix, but the disclosure is not limited thereto. At least one of the driver circuits P1 to Pn may be the driver circuit 100, that is, it may include the electronic unit 110, the driver unit 120, and the detection and protection circuit 130. According to some embodiments, each of the driver circuits P1 to Pn may be the driver circuit 100. According to some embodiments, the electronic unit 110 may be a light emitting unit and constitute an electronic device 100D with display function. For example, the substrate module 100S itself may constitute a display panel for image display. Alternatively, according to some embodiments, the electronic unit 110 may be a light emitting unit, and the substrate module 100S itself may be used as a backlight module. The substrate module 100S as a backlight module may be combined with a liquid crystal display panel to form an electronic device 100D with display function. For example, when the driver circuits P1 to Pn are used as display panels for image display, one driver circuit may only include a single light emitting unit. When the driver circuits P1 to Pn are used as backlight modules, one driver circuit may include multiple light emitting units connected in series respectively, but this embodiment is not limit thereto. According to some embodiments, the electronic unit 110 may be a non-light emitting unit. According to some embodiments, the electronic device 100D may be an antenna device, a liquid crystal display device, or a varactor device.

Figure 3:
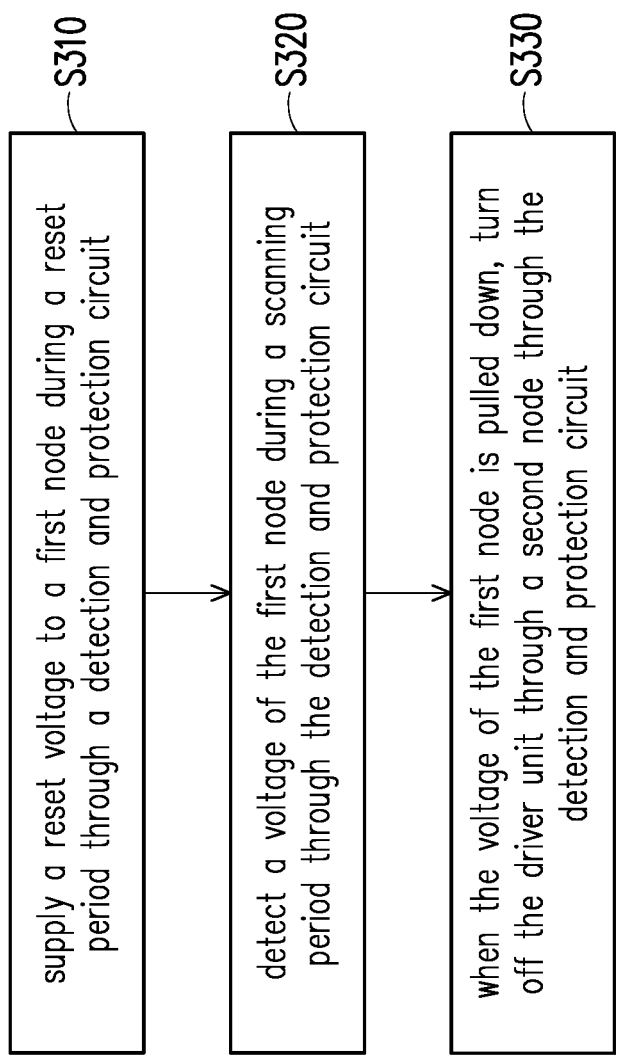
FIG. 3 is a schematic flowchart of a driving method according to an embodiment of the disclosure.

FIG. 3 is a schematic flowchart of a driving method according to an embodiment of the disclosure. For the driver circuit 100 shown in FIG. 1, reference may be made to the related description of FIG. 3. Referring to FIG. 1 and FIG. 3 at the same time, in step S310, the driver circuit 100 may supply a reset voltage (or a reference voltage) to the first node N1 during a reset period through the detection and protection circuit 130. In step S320, the detection and protection circuit 130 may detect a voltage of the first node N1 during a scanning period. In step S330, when the detection and protection circuit 130 detects that the voltage of the first node N1 is pulled down, the detection and protection circuit 130 may turn off the driver unit 120 through the second node N2.

Figure 4:
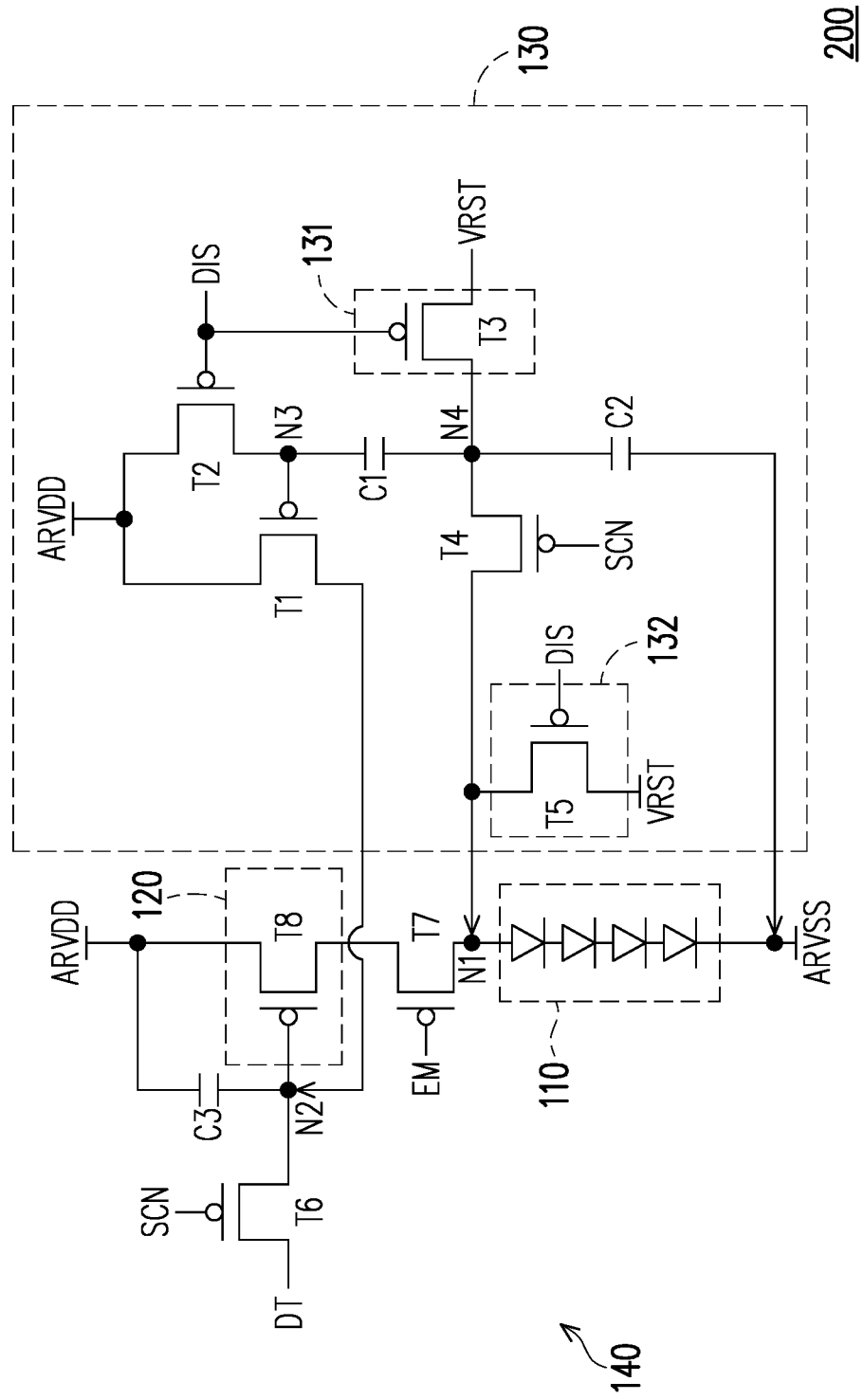
FIG. 4 is a schematic circuit diagram of a driver circuit according to an embodiment of the disclosure.
Figure 5:
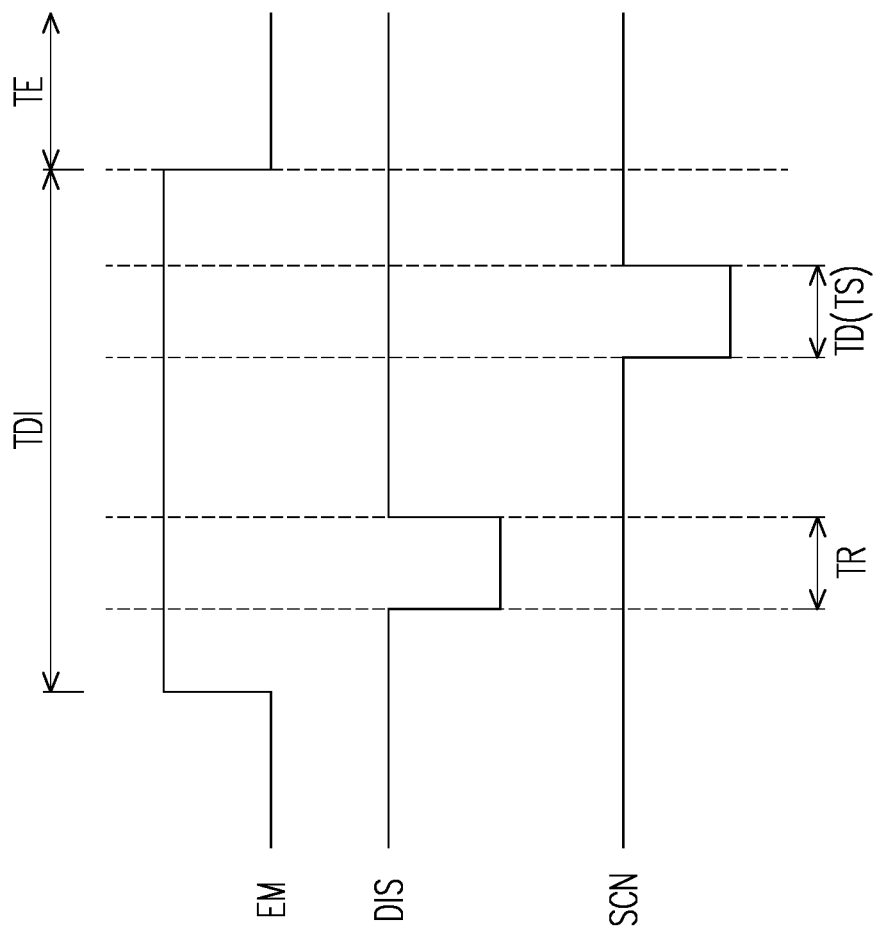
FIG. 5 is a schematic diagram of operation waveforms of a driver circuit according to an embodiment of the disclosure.

Referring to FIG. 4 and FIG. 5, FIG. 4 is a schematic circuit diagram of a driver circuit 200 according to an embodiment of the disclosure. FIG. 5 is a schematic diagram of operation waveforms of a driver circuit according to an embodiment of the disclosure. The driver circuit 200 shown in FIG. 4 may be used as an implementation example of the driver circuit 100 shown in FIG. 1. The embodiment shown in FIG. 5 may be used as a schematic diagram of operation waveforms of the driver circuit 200 shown in FIG. 4, a driver circuit 400 shown in FIG. 8, a driver circuit 500 shown in FIG. 9, a driver circuit 600 shown in FIG. 10, a driver circuit 700 shown in FIG. 11, and (or) a driver circuit 800 shown in FIG. 12. In the embodiment shown in FIG. 4, the driver circuit 200 includes a pixel circuit 140 and a detection and protection circuit 130. The pixel circuit 140 may include the electronic unit 110 and the driver unit 120. According to actual requirements, in some embodiments, the pixel circuit 140 may further include a switch unit T6, a control unit T7, a capacitor C3 and/or other components not shown in FIG. 4, which are not limited by this embodiment. In this embodiment, the electronic unit 110 may include multiple electronic units (e.g., four in this embodiment) connected in series, but the number and arrangement thereof are only an exemplary example, and this embodiment is not limit thereto. According to some embodiments, the electronic unit 110 may include multiple light emitting units.

In this embodiment, the driver unit 120 may include a transistor T8. For the convenience of description, the switch unit T6, the control unit T7, and the transistor T8 are all transistors of P-type conductivity, but this embodiment is not limited thereto. In this embodiment, a first end of the switch unit T6 may receive a data voltage DT. A control end of the switch unit T6 may receive a scan signal SCN. A first end of the transistor T8 may receive a voltage ARVDD (a first voltage). The driver unit 120 (e.g., a control end of the transistor T8) may be electrically connected to a second end of the switch unit T6 through the second node N2. One end of the capacitor C3 may receive the first voltage ARVDD, and an other end of the capacitor C3 may be electrically connected to the second node N2. In this embodiment, the driver unit 120 (e.g., a second end of the transistor T8) may be electrically connected to the first node N1 through a first end of the control unit T7. A control end of the control unit T7 may receive an enable signal EM. One end of the electronic unit 110 (e.g., anode ends of multiple light emitting components) may be electrically connected to a second end of the control unit T7 through the first node N1. An other end of the electronic unit 110 (e.g., cathode ends of multiple light emitting components) may receive a voltage ARVSS (a second voltage). In this embodiment, a voltage level of the first voltage ARVDD may be higher than a voltage level of the second voltage ARVSS. For example, in some embodiments, the first voltage ARVDD may be a DC high level, and the second voltage ARVSS may be a DC low level or a ground level. In some embodiments, the switch unit T6, the control unit T7, and/or the transistor T8 may also be transistors of N-type conductivity. In some embodiments, the voltage level of the first voltage ARVDD may also be lower than the voltage level of the second voltage ARVSS. For example, the conductivity of transistor T8 is N-type, the first voltage ARVDD may be a DC low level or a ground level, and the second voltage ARVSS may be a DC high level.

In this way, for the pixel circuit 140, the switch unit T6 may transmit the data voltage DT to the second node N2 according to the scan signal SCN. That is, the switch unit T6 may be configured to supply the data voltage DT to the second node N2 during a scanning period TS. The capacitor C3 may stabilize a voltage level on the second node N2 according to the first voltage ARVDD. The transistor T8 in the driver unit 120 may transmit the first voltage ARVDD to the second end of the transistor T8 according to the voltage level on the second node N2. The control unit T7 may transmit a voltage level on the second end of the transistor T8 to the electronic unit 110 through the first node N1 according to the enable signal EM, so that the electronic unit 110 may be driven according to a potential difference between the first node N1 and the second voltage ARVSS. That is, the control unit T7 is configured to be turned off to stop power supply to the first node N1 during a data writing period TDI. In some embodiments, the electronic unit 110 may be a light emitting unit, so that the electronic unit 110 may emit light according to the potential difference between the first node N1 and the second voltage ARVSS.

According to actual design requirements, in some embodiments, the detection and protection circuit 130 may include a transistor T1 (a first transistor), a transistor T2 (a second transistor), a transistor T4 (a third transistor), a capacitor C1 (a first capacitor), a capacitor C2 (a second capacitor), a reset unit 131, a reset unit 132, and/or other components not shown in FIG. 4, and this embodiment is not limited thereto. The first transistor T1 may be electrically connected to the second node N2, and is configured to supply the first voltage ARVDD to the second node N2 to turn off the driver unit 120. The reset unit 131 may be electrically connected to an other end of the first capacitor C1 through a fourth node N4, and the reset unit 132 may be electrically connected to the first node N1. In this embodiment, the reset unit 131 may include a transistor T3, and the reset unit 132 may include a transistor T5, but this embodiment is not limited thereto. For the convenience of description, the transistors T1 to T5 are all thin film transistors (TFT) of P-type conductivity, but this embodiment is not limited thereto. In some embodiments, at least one of the transistors T1 to T5 may also be a transistor with of N-type conductivity. In this embodiment, a first end of the first transistor T1 may receive the first voltage ARVDD. A second end of the first transistor T1 may be electrically connected to the control end of the transistor T8 in the driver unit 120 through the second node N2. In this embodiment, the first capacitor C1 has a node N3 (a third node) at one end, and the first capacitor C1 may be electrically connected to a gate terminal (a control end) of the first transistor T1 through the third node N3. In this embodiment, one end of the second capacitor C2 may be electrically connected to the other end of the first capacitor C1 through the fourth node N4. In some embodiments, an other end of the second capacitor C2 may receive the second voltage ARVSS. In other embodiments, the other end of the second capacitor C2 may also receive the first voltage ARVDD or other DC levels, and this embodiment is not limited thereto.

In some embodiments, a first end of the second transistor T2 may receive the first voltage ARVDD. A second end of the second transistor T2 may be electrically connected to the third node N3. A control end of the second transistor T2 may receive a reset signal DIS. In some embodiments, a first end of the transistor T3 in the reset unit 131 may receive a reset voltage VRST. A second end of the transistor T3 may be electrically connected to the fourth node N4. A control end of the transistor T3 may receive the reset signal DIS. In some embodiments, a first end of the third transistor T4 may be electrically connected to the fourth node N4. A control end of the third transistor T4 may receive the scan signal SCN. In some embodiments, a first end of the transistor T5 in the reset unit 132 may receive the reset voltage VRST. A second end of the transistor T5 may be electrically connected to the first node N1 together with a second end of the third transistor T4. A control end of the transistor T5 may receive the reset signal DIS. The reset voltage VRST may be a DC level between the first voltage ARVDD and the second voltage ARVSS. In some embodiments, the reset voltage VRST may be lower than a voltage level required to drive the electronic unit 110 to prevent the electronic unit 110 from being driven by the reset voltage VRST. For example, in some embodiments, the first voltage ARVDD may be set to 15 volts, and the second voltage ARVSS may be set to 0 volts. Assuming that the voltage level required to drive the electronic unit 110 is 10 volts (2.5*4), the reset voltage VRST may be set to 9 volts, but this embodiment is not limited thereto.

In this way, for the detection and protection circuit 130, the second transistor T2 may transmit the first voltage ARVDD to the third node N3 according to the reset signal DIS. The transistor T3 in the reset unit 131 may transmit the reset voltage VRST to the fourth node N4 according to the reset signal DIS. The transistor T5 in the reset unit 132 may transmit the reset voltage VRST to the first node N1 according to the reset signal DIS. The second capacitor C2 may be used as a stabilizing capacitor to stabilize a voltage level on the fourth node N4 according to the second voltage ARVSS (or the first voltage ARVDD or other DC levels). The third transistor T4 may turn on the fourth node N4 and the first node N1 according to the scan signal SCN. The first transistor T1 may provide the first voltage ARVDD to the second node N2 according to a voltage level of the third node N3. If at least any one of multiple electronic units in the electronic unit 110 is short-circuited or damaged, a voltage level of the first node N1 is pulled down instantaneously, and a voltage level of the fourth node N4 is also pulled down. At this time, the voltage level of the third node N3 is also pulled down due to the coupling of the first capacitor C1. For example, if the voltage level of the first node N1 is pulled down from the reset voltage VRST to a short-circuit voltage VST (VST<VRST), the voltage level of the third node N3 is ARVDD+(VST−VRST). When a potential difference between a control end and the second end of the first transistor T1 is lower than a threshold voltage VTH of the first transistor T1, i.e., ARVDD+(VST−VRST)<ARVDD−VTH, the first transistor T1 is turned on. The first transistor T1 supplies the first voltage ARVDD to the second node N2 to cut off (turn off) the transistor T8 in the driver unit 120, so that the transistor T8 stops power supply to the first node N1 and further protects the electronic unit 110 from excessive current.

The waveform diagram of the above operation can be referred to the embodiment shown in FIG. 5. A horizontal axis shown in FIG. 5 represents time. In the embodiment shown in FIG. 5, when the electronic unit 110 shown in FIG. 4 is to be driven, the enable signal EM may be switched from a logic low level to a logic high level, so that the driver circuit 200 enters a data writing period TDI. At this time, the control unit T7 in the pixel circuit 140 is turned off, i.e., from an on state to an off state, to stop the power supply to the first node N1. In the data writing period TDI, when the reset signal DIS is switched from the logic high level to the logic low level, the driver circuit 200 enters a reset period TR. At this time, the second transistor T2 in the detection and protection circuit 130 may supply the first voltage ARVDD to the third node N3 (i.e., one end of the first capacitor C1), the transistor T3 in the reset unit 131 may transmit the reset voltage VRST to the fourth node N4 (i.e., the other end of the first capacitor C1), and the transistor T5 in the reset unit 132 may supply the reset voltage VRST to the first node N1. The first node N1 and the fourth node N4 are both charged to the reset voltage VRST, and the third node N3 is charged to the first voltage ARVDD (assumed to be the logic high level here), at which time the first transistor T1 is turned off.

Assuming that the electronic unit 110 is operating normally (e.g., all light emitting units can emit light normally), the voltage level of the first node N1 will remain unchanged (the reset voltage VRST). Then, when the scan signal SCN is switched from the logic high level to the logic low level, the driver circuit 200 enters the scanning period TS (which is equivalent to a detection period TD). The switch unit T6 in the pixel circuit 140 may transmit the data voltage DT to the second node N2, and the third transistor T4 may turn on the first node N1 and the fourth node N4 (i.e., the other end of the first capacitor C1). That is, according to some embodiments, the third transistor T4 is electrically connected to the first node N1, and the third transistor T4 is configured to turn on the first node N1 and the other end of the first capacitor C1 during the detection period TD or the scanning period TS. Since the voltage levels of the first node N1 and the fourth node N4 are the same, the first capacitor C1 is in a floating state, so the voltage level of the third node N3 will remain unchanged (the first voltage ARVDD), so that the first transistor T1 remains in the off state. Finally, when the data voltage DT is completely written and the enable signal EM is switched from the logic high level to the logic low level, the driver circuit 200 enters a lighting period TE. At this time, the control unit T7 is switched from the off state to the on state, and the transistor T8 in the driver unit 120 transmits the first voltage ARVDD to the first node N1 through the control unit T7 according to the data voltage DT to drive the electronic unit 110. Therefore, the detection and protection circuit 130 will not affect the normal operation of the pixel circuit 140 in the absence of voltage abnormalities in the electronic unit 110.

In addition, if at least any one of multiple light emitting units in the electronic unit 110 is short-circuited or damaged, the voltage level of the first node N1 will be pulled down instantaneously. Then, when the scan signal SCN is switched from the logic high level to the logic low level, the driver circuit 200 enters the scanning period TS. The switch unit T6 transmits the data voltage DT to the second node N2, and the third transistor T4 turns on the first node N1 and the fourth node N4. Since the voltage level of the first node N1 is pulled down, the voltage levels of the fourth node N4 and the third node N3 are also pulled down sequentially. Then, when the voltage level of the third node N3 is so low that the first transistor T1 is turned on, the second node N2 is charged to the first voltage ARVDD through the first transistor T1, and the transistor T8 is turned off. Finally, when the enable signal EM is switched from the logic high level to the logic low level, the driver circuit 200 enters the lighting period TE. At this time, although the control unit T7 is switched from the off state to the on state, the transistor T8 remains in the off state at this time, so that no current flows through the electronic unit 110, which protects the electronic unit 110 from excessive current.

Figure 6:
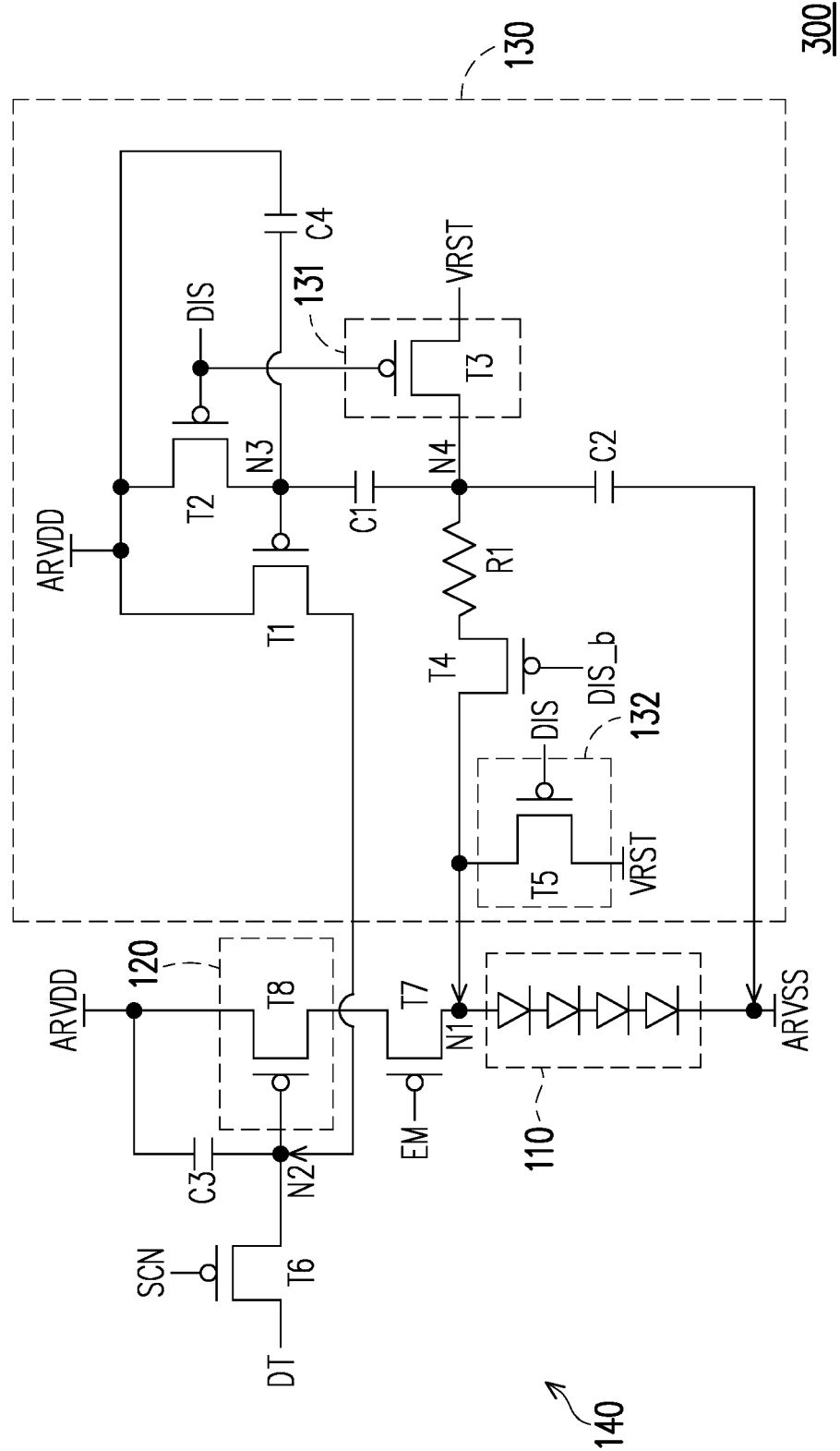
FIG. 6 is a schematic circuit diagram of a driver circuit according to still another embodiment of the disclosure.
Figure 7:
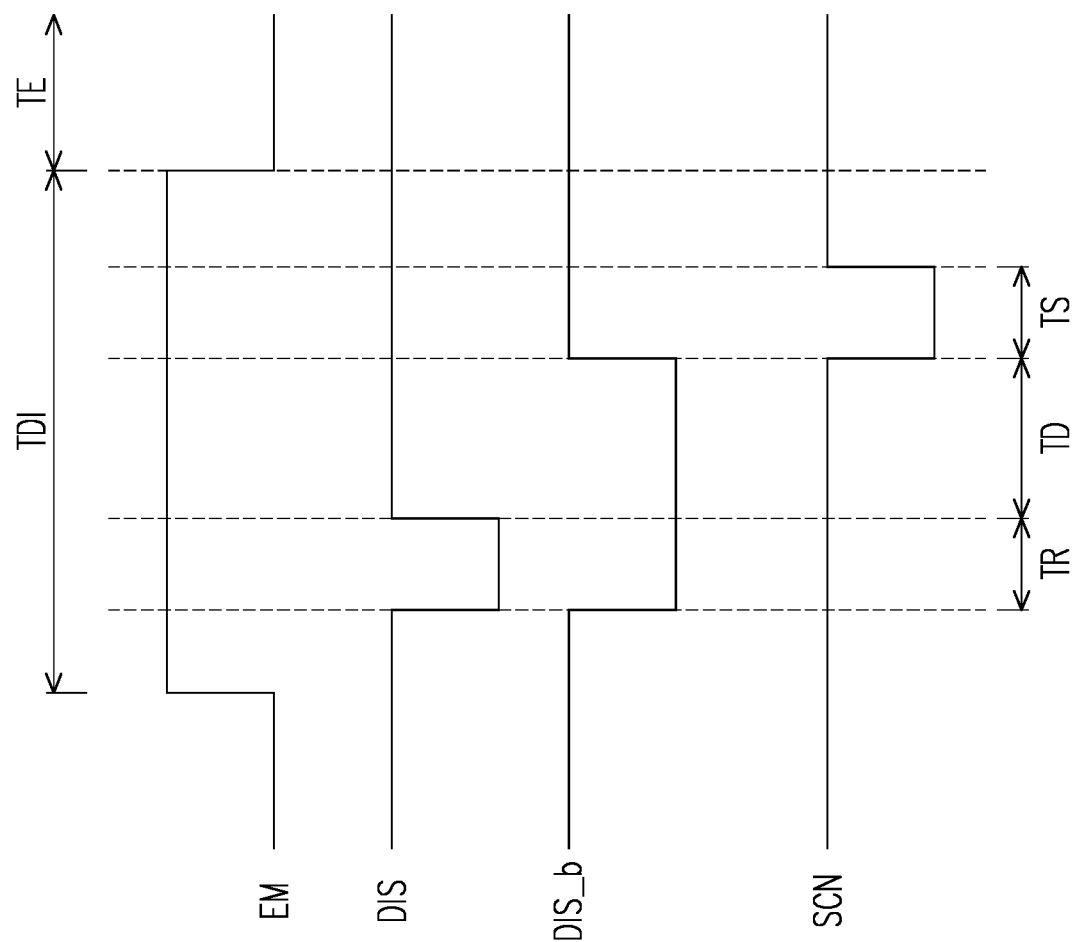
FIG. 7 is a schematic diagram of operation waveforms of a driver circuit according to still another embodiment of the disclosure.

Referring to FIG. 6 and FIG. 7, FIG. 6 is a schematic circuit diagram of a driver circuit 300 according to still another embodiment of the disclosure. FIG. 7 is a schematic diagram of operation waveforms of a driver circuit according to still another embodiment of the disclosure. The driver circuit 300 shown in FIG. 6 can be used as an implementation example of the driver circuit 100 shown in FIG. 1. In the embodiment shown in FIG. 6, the driver circuit 300 includes the pixel circuit 140 and the detection and protection circuit 130. The implementation of the pixel circuit 140 can be referred to the relevant description of the pixel circuit 140 shown in FIG. 4 and will not be repeated here. The difference from the embodiment shown in FIG. 4 is that the control end of the third transistor T4 shown in FIG. 6 may also receive a reset signal DIS_b different from the scan signal SCN. According to actual requirements, in some embodiments, the detection and protection circuit 130 shown in FIG. 6 may further include a capacitor C4 (a third capacitor) and/or a resistor R1. One end of the third capacitor C4 may be electrically connected to the third node N3, and an other end of the third capacitor C4 may receive the first voltage ARVDD. The third capacitor C4 may stabilize a current on the third node N3. One end of the resistor R1 may be electrically connected to the first end of the third transistor T4, and an other end of the resistor R1 may be electrically connected to the other end of the first capacitor C1 through the fourth node N4. For the resistor R1, its resistance cross-voltage is a potential difference between the first node N1 and the fourth node N4.

The waveform diagram of the operation of the embodiment shown in FIG. 6 can be referred to the embodiment shown in FIG. 7. A horizontal axis shown in FIG. 7 represents time. In the embodiment shown in FIG. 7, the implementation of the enable signal EM, the reset signal DIS, and the scan signal SCN can be referred to the related descriptions of the enable signal EM, the reset signal DIS, and the scan signal SCN shown in FIG. 5. The difference from the embodiment shown in FIG. 5 is that the operation waveform diagram shown in FIG. 7 further includes a reset signal DIS_b. In detail, when the enable signal EM is switched from the logic low level to the logic high level, the driver circuit 300 shown in FIG. 6 enters the data writing period TDI. At this time, the control unit T7 is switched from the on state to the off state to stop power supply to the electronic unit 110. In the data writing period TDI, when the reset signal DIS and the reset signal DIS_b are both switched from the logic high level to the logic low level, the driver circuit 300 enters the reset period TR. At this time, the third node N3 is charged to the first voltage ARVDD through the second transistor T2, the first transistor T1 is turned off, and the third capacitor C4 may stabilize the voltage level of the third node N3 according to the first voltage ARVDD. The fourth node N4 is charged to the reset voltage VRST through the transistor T3, and the first node N1 is charged to the reset voltage VRST through the transistor T5.

Next, when the reset signal DIS is switched from the logic low level to the logic high level, and the reset signal DIS_b remains at the logic low level, the driver circuit 300 enters a detection period TD (different from the detection period TD in FIG. 5, which is equivalent to the scanning period TS). At this time, the second transistor T2, the transistor T3, and the transistor T5 are switched from the on state to the off state, and the third transistor T4 remains the on state. Assuming that at least any one of multiple light emitting units in the electronic unit 110 is short-circuited or damaged, the voltage level of the first node N1 and a voltage level of one end of the resistor R1 (electrically connected to the third transistor T4) is pulled down instantaneously, so that the voltage levels of the fourth node N4 and the third node N3 are also pulled down sequentially. Then when the voltage level of the third node N3 is so low that the first transistor T1 is turned on, the second node N2 is charged to the first voltage ARVDD through the first transistor T1 to turn off the transistor T8, and then stop the power supply to the electronic unit 110 to protect the electronic unit 110 from excessive current. In this embodiment, the driver circuit 300 in FIG. 6 is used to illustrate the situation where the detection and protection circuit 130 controls the driver unit 120 to turn off when the voltage of the first node N1 is pulled down. However, like the driver circuit 300 of FIG. 6, the driver circuit 200 of FIG. 5 may also realize the situation where the detection and protection circuit 130 controls the driver unit 120 to turn off when the voltage of the first node N1 is pulled down according to some embodiments, which will not be repeated in the following.

Figure 8:
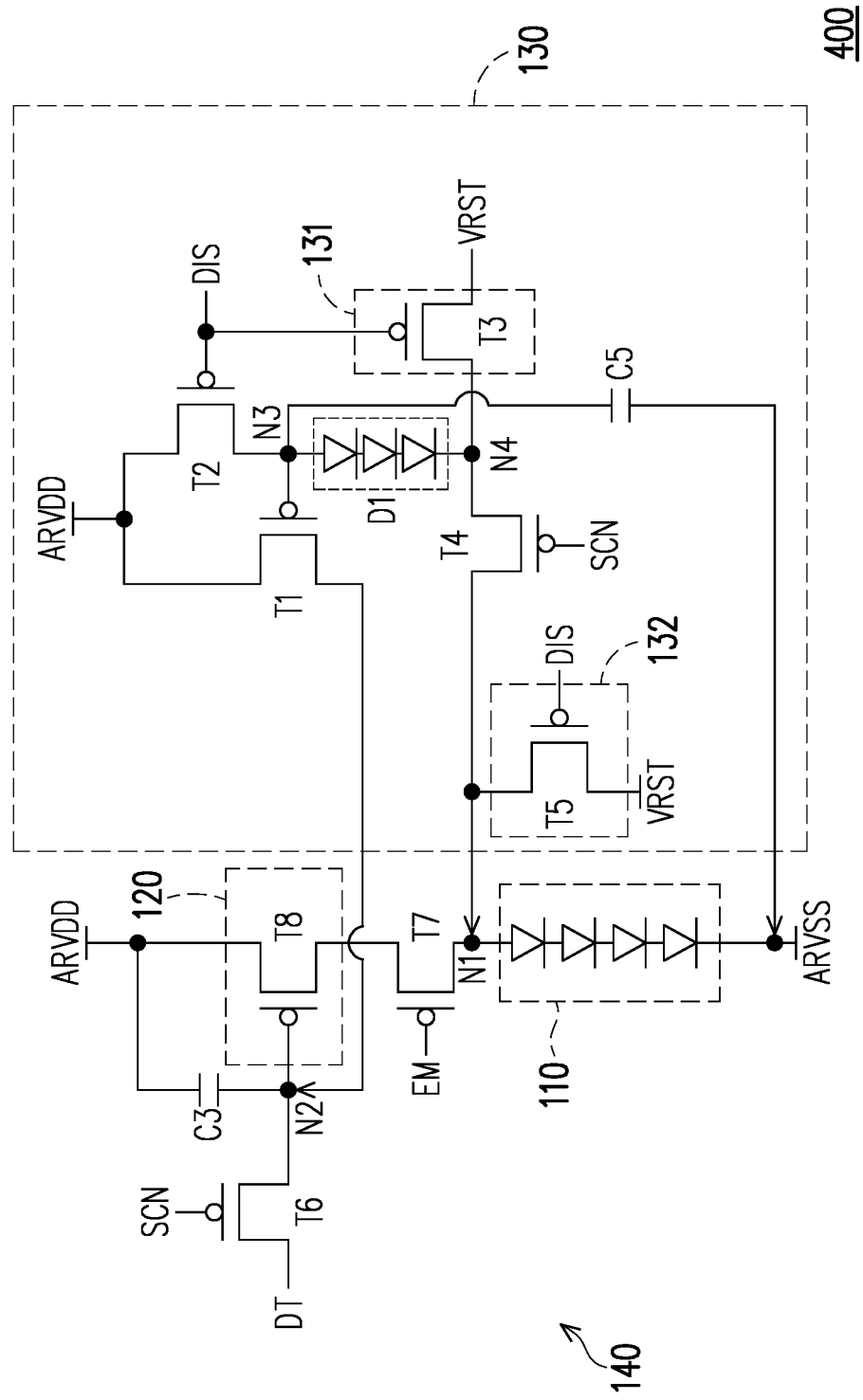
FIG. 8 is a schematic circuit diagram of a driver circuit according to yet another embodiment of the disclosure.

FIG. 8 is a schematic circuit diagram of a driver circuit 400 according to yet another embodiment of the disclosure. The driver circuit 400 shown in FIG. 8 can be used as an implementation example of the driver circuit 100 shown in FIG. 1. In the embodiment shown in FIG. 8, the driver circuit 400 includes the pixel circuit 140 and the detection and protection circuit 130. The implementation of the pixel circuit 140 can be referred to the related description of the pixel circuit 140 shown in FIG. 4, and therefore will not be repeated in the following. The difference from the embodiment shown in FIG. 4 is that, according to actual requirements, the detection and protection circuit 130 shown in FIG. 8 may use one or more diodes D1 (e.g., three in this embodiment) connected in series and/or a capacitor C5 to replace the first capacitor C1 and/or the second capacitor C2 in the embodiment shown in FIG. 4. In detail, one end (e.g., anode end) of the one or more diodes D1 may be electrically connected to the third node N3, and an other end (e.g., cathode end) of the one or more diodes D1 may be electrically connected to the first end of the third transistor T4 through the fourth node N4. One end of the capacitor C5 may be electrically connected to the third node N3, and an other end of the capacitor C5 may receive the second voltage ARVSS or other voltage levels. The capacitor C5 may be used as a stabilizing capacitor to stabilize a voltage level on the third node N3 according to the second voltage ARVSS or other voltage levels. In some embodiments, the one or more diodes D1 may be implemented by a transistor, and this embodiment is not limited thereto.

The detailed operation waveforms of the embodiment shown in FIG. 8 may be referred to the embodiment shown in FIG. 5. It should be noted that, in the reset period TR, the third node N3 shown in FIG. 8 is charged to the first voltage ARVDD through the second transistor T2, and the fourth node N4 is charged to the reset voltage VRST through the transistor T3. In some embodiments, a potential difference ARVDD-VRST between the third node N3 and the fourth node N4 may be smaller than a voltage level at which the one or more diodes D1 are turned on to avoid the one or more diodes D1 being driven during the reset period TR. In the scanning period TS, the third transistor T4 may turn on (e.g., through the fourth node N4) the first node N1 and the other end of the one or more diodes D1. Assuming that at least any one of multiple light emitting units in the electronic unit 110 is short-circuited or damaged, the voltage levels of the first node N1 and the fourth node N4 is instantaneously pulled down from the reset voltage VRST to the short-circuit voltage VST, and assuming that the voltage level of the third node N3 is Vc', a cross-voltage of the one or more diodes D1, i.e. a voltage difference Vc'-VST between the third node N3 and the fourth node N4, may be greater than or equal to a voltage level at which the one or more diodes D1 are turned on. In this way, since the one or more diodes D1 are turned on, the voltage level of the third node N3 is also pulled down. Then, when the voltage level of the third node N3 is so low that the first transistor T1 is turned on, the second node N2 is charged to the first voltage ARVDD to turn off the transistor T8, thereby stopping power supply to the first node N1. The remaining details of the operation and waveforms of the driver circuit 400 shown in FIG. 8 in the situation where the electronic unit 110 is in normal operation or at least any one of multiple light emitting units is short-circuited or damaged can be analogously derived from the relevant descriptions of the embodiments shown in FIG. 4 and FIG. 5, and therefore will not be repeated in the following.

Figure 9:
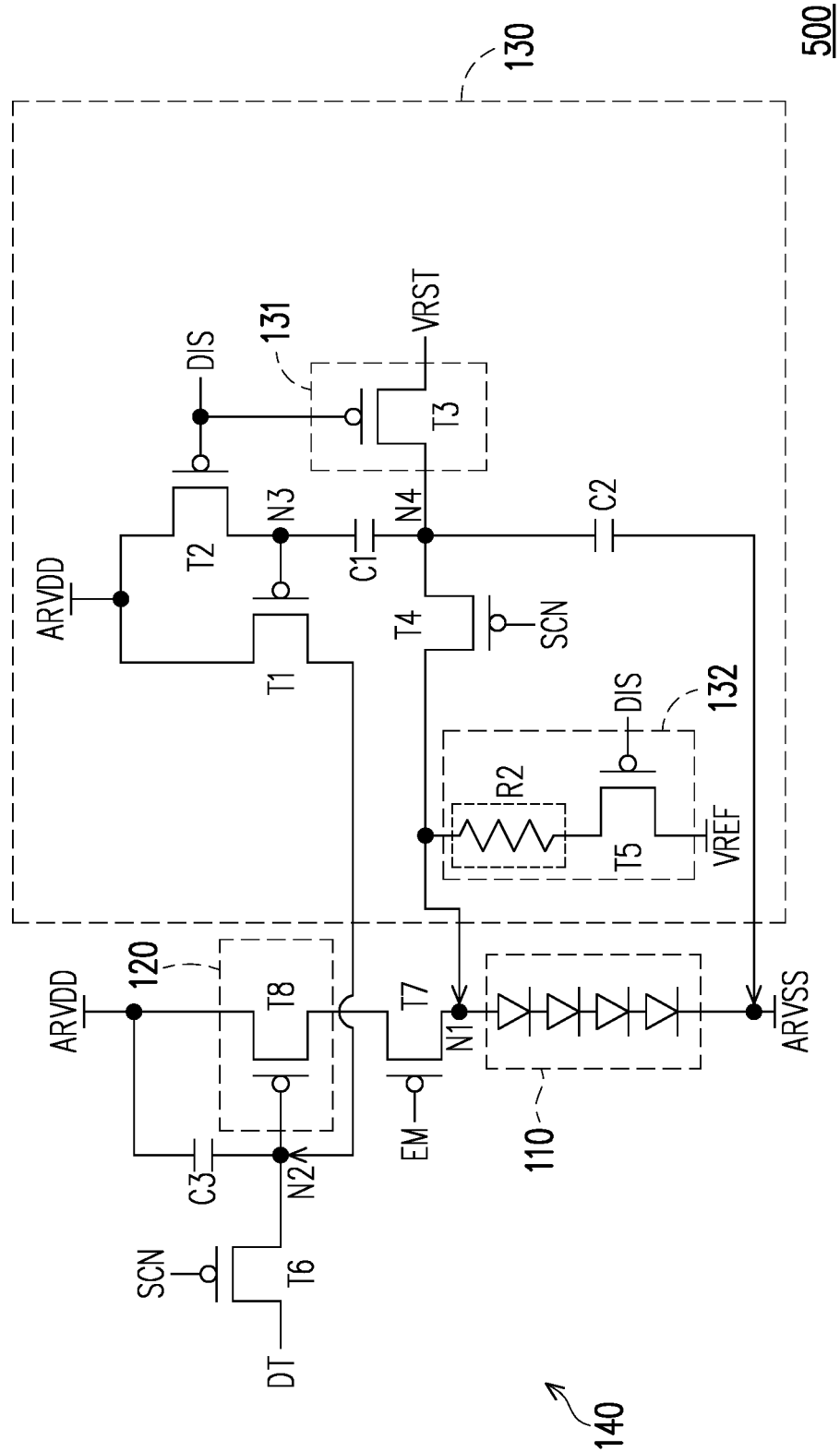
FIG. 9 is a schematic circuit diagram of a driver circuit according to yet another embodiment of the disclosure.

FIG. 9 is a schematic circuit diagram of a driver circuit 500 according to yet another embodiment of the disclosure. The driver circuit 500 shown in FIG. 9 can be used as an implementation example of the driver circuit 100 shown in FIG. 1. In the embodiment shown in FIG. 9, the driver circuit 500 includes the pixel circuit 140 and the detection and protection circuit 130. The implementation of the pixel circuit 140 may be referred to the related description of the pixel circuit 140 shown in FIG. 4, and therefore will not be repeated in the following. The difference from the embodiment shown in FIG. 4 is that, according to actual requirements, the reset circuit 132 shown in FIG. 9 may include the transistor T5 and/or a resistor R2. In detail, the first end of the transistor T5 may receive a reference voltage VREF, the second end of the transistor T5 may be electrically connected to one end of the resistor R2, an other end of the resistor R2 may be electrically connected to the first node N1, and the control end of the transistor T5 may receive the reset signal DIS. In other embodiments, the reset unit 132 may also not include the resistor R2 and use a smaller reference voltage VREF, and this embodiment is not limited thereto.

The detailed operation waveforms of the embodiment shown in FIG. 9 may be referred to the embodiment shown in FIG. 5. It should be noted that, in some embodiments, the reference voltage VREF shown in FIG. 9 may be lower than the reset voltage VRST. In addition, in some embodiments, a voltage level (VREF') to which the first node N1 is charged through the reset unit 132 during the reset period TR may be lower than the voltage level required to drive the electronic unit 110 to avoid the electronic unit 110 being driven prematurely. In some embodiments, the first voltage ARVDD may be set to 15 volts, and the second voltage ARVSS may be set to 0 volts. Assuming that the voltage level required to drive the electronic unit 110 is 10 volts, the reset voltage VRST may be set to 9 volts, the reference voltage VREF may be set to 4 volts, and the voltage level VREF' of the first node N1 during the reset period TR may be 8 volts (or any DC level between 7.5 and 10 volts), so that the voltage level VREF' is less than the voltage level required to drive the electronic unit 110, or VREF<VREF'<VRST<ARVDD, but this embodiment is not limited thereto. In this way, during the reset period TR, the first node N1 and the fourth node N4 in the detection and protection circuit 130 may be charged to different voltage levels according to actual application requirements, i.e., the reference voltage VREF may be supplied to the first node N1 through the reset unit 132, and the voltage level of the first node N1 may be determined by using the reference voltage VREF or the voltage division of the reference voltage VREF and the resistor R2 to further increase the application scope of the detection and protection circuit 130. In addition, using the reference voltage VREF lower than the reset voltage VRST to charge the first node N1 may increase the sensitivity of the first node N1, increase the potential difference between the first node N1 and the fourth node N4, and increase a cross-voltage of the first capacitor C1, thereby increasing the response speed and turn-off speed of the transistor T8. The details of the operation and waveforms of the driver circuit 500 shown in FIG. 9 in the situation where the electronic unit 110 is in normal operation or at least any one of multiple light emitting units is short-circuited or damaged can be analogously derived from the relevant descriptions of the embodiments shown in FIG. 4 and FIG. 5, and therefore will not be repeated in the following.

Figure 10:
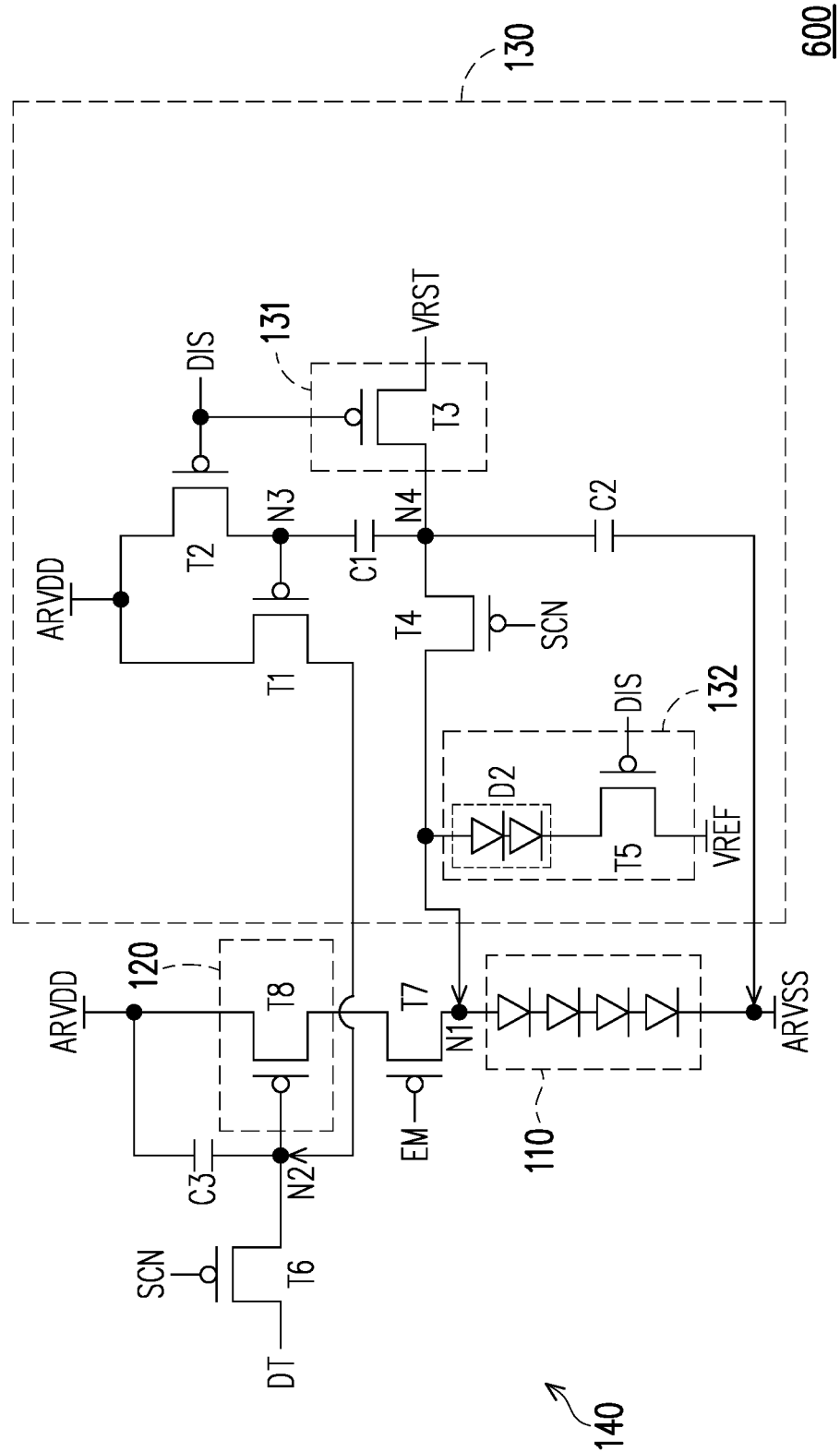
FIG. 10 is a schematic circuit diagram of a driver circuit according to yet another embodiment of the disclosure.

FIG. 10 is a schematic circuit diagram of a driver circuit 600 according to yet another embodiment of the disclosure. The driver circuit 600 shown in FIG. 10 may be used as an implementation example of the driver circuit 100 shown in FIG. 1. In the embodiment shown in FIG. 10, the driver circuit 600 includes the pixel circuit 140 and the detection and protection circuit 130. The implementation of the pixel circuit 140 may be referred to the related description of the pixel circuit 140 shown in FIG. 4, and therefore will not be repeated in the following. The difference from the embodiment shown in FIG. 4 is that, according to actual requirements, the reset circuit 132 shown in FIG. 10 may include the transistor T5 and/or one or more diodes D2 (e.g., two in this embodiment) connected in series. In detail, the first end of the transistor T5 may receive the reference voltage VREF, the second end of the transistor T5 may be electrically connected to one end (e.g., the cathode end) of the one or more diodes D2, and an other end (e.g., the anode end) of the one or more diodes D2 may be electrically connected to the first node N1, and the control end of the transistor T5 may receive the reset signal DIS. In some embodiments, the one or more diodes D2 may be implemented by transistors, and this embodiment is not limited thereto. The details of the operation and waveforms of the driver circuit 600 shown in FIG. 10 in the situation where the electronic unit 110 is in normal operation or at least any one of multiple light emitting units is short-circuited or damaged can be analogously derived from the relevant descriptions of the embodiments shown in FIG. 9 and FIG. 5, and therefore will not be repeated in the following.

Figure 11:
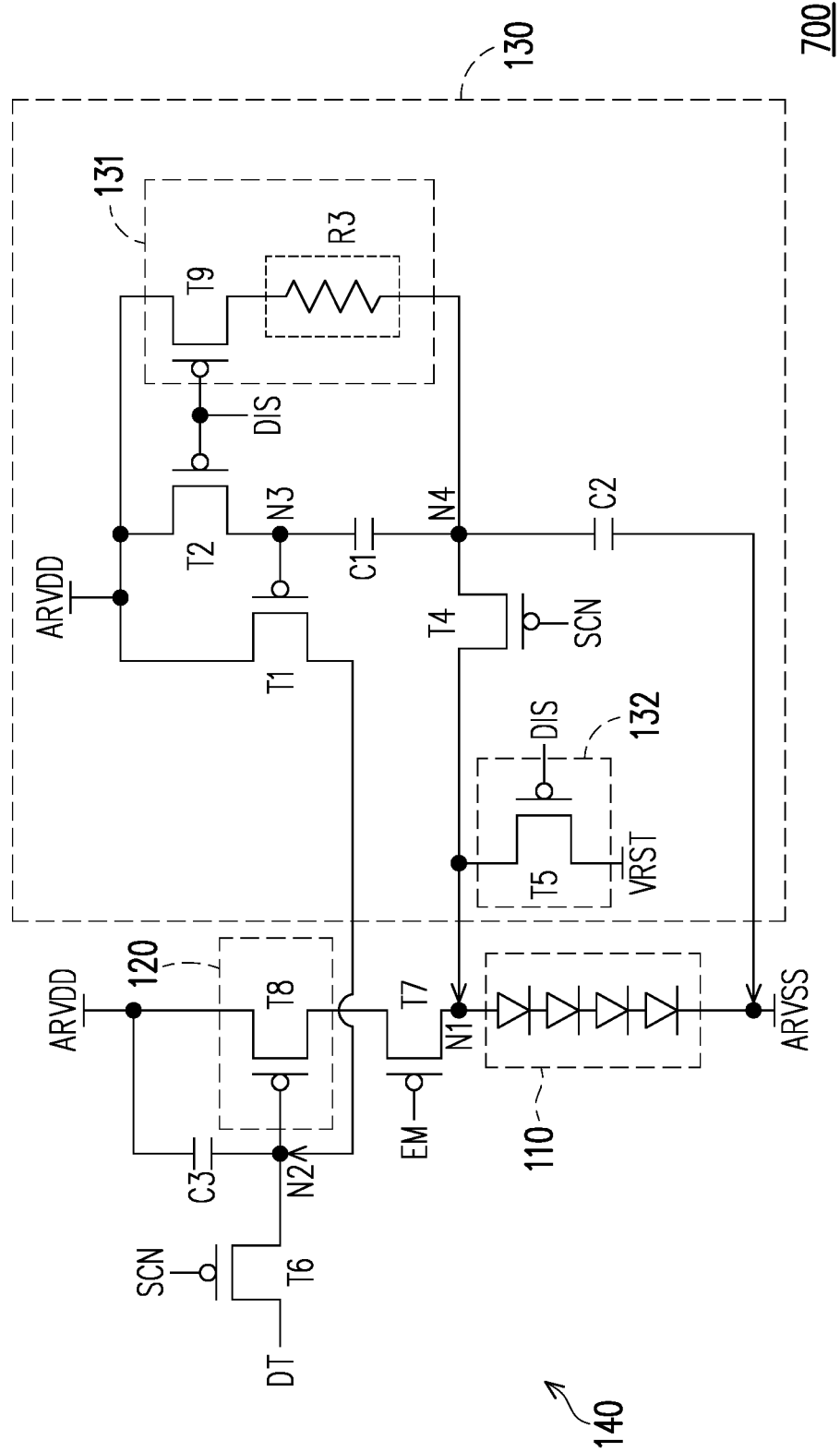
FIG. 11 is a schematic circuit diagram of a driver circuit according to yet another embodiment of the disclosure.

FIG. 11 is a schematic circuit diagram of a driver circuit 700 according to yet another embodiment of the disclosure. The driver circuit 700 shown in FIG. 11 can be used as an implementation example of the driver circuit 100 shown in FIG. 1. In the embodiment shown in FIG. 11, the driver circuit 700 includes the pixel circuit 140 and the detection and protection circuit 130. The implementation of the pixel circuit 140 may be referred to the related description of the pixel circuit 140 shown in FIG. 4, and therefore will not be repeated in the following. The difference from the embodiment shown in FIG. 4 is that, according to actual requirements, the reset unit 131 shown in FIG. 11 may include a transistor T9 and/or a resistor R3. In detail, a first end of the transistor T9 may receive the first voltage ARVDD, a second end of the transistor T9 may be electrically connected to one end of the resistor R3, an other end of the resistor R3 may be electrically connected to the fourth node N4, and a control end of the transistor T9 may receive the reset signal DIS.

The detailed operation waveforms of the embodiment shown in FIG. 11 may be referred to the embodiment shown in FIG. 5. It should be noted that, in some embodiments, a voltage level ARVDD' at which the fourth node N4 is charged through the reset unit 131 during the reset period TR may be greater than the reset voltage VRST, and since the reset unit 131 has the resistor R3, the voltage level ARVDD' must be lower than the first voltage ARVDD, i.e., VRST<ARVDD'<ARVDD, but this embodiment is not limited thereto. Then during the scanning period TS, if any one or more of multiple light emitting units in the electronic unit 110 is short-circuited or damaged, the voltage level of the first node N1 is pulled down, and the voltage level of the fourth node N4 is also pulled down. When the potential difference between the control end and the second end of the first transistor T1 is lower than the threshold voltage VTH of the first transistor T1, that is, when ARVDD (VST-ARVDD') <ARVDD-VTH, the first transistor T1 is turned on and the first voltage ARVDD is supplied to the second node N2 to cut off the transistor T8, and then the power supply to the first node N1 is stopped. In this way, during the reset period TR, the first node N1 and the fourth node N4 in the detection and protection circuit may be charged to different voltage levels according to actual application requirements, i.e., the first voltage ARVDD may be supplied to the fourth node N4 (the other end of the first capacitor C1) through the reset unit 131, and the voltage level of the fourth node N4 may be determined by using the voltage division between the first voltage ARVDD and the resistor R3 to further increase the application scope of the detection and protection circuit 130. The details of the operation and waveforms of the driver circuit 700 shown in FIG. 11 in the situation where the electronic unit 110 is in normal operation or at least any one of multiple light emitting units is short-circuited or damaged can be analogously derived from the relevant descriptions of the embodiments shown in FIG. 4 and FIG. 5, and therefore will not be repeated in the following.

Figure 12:
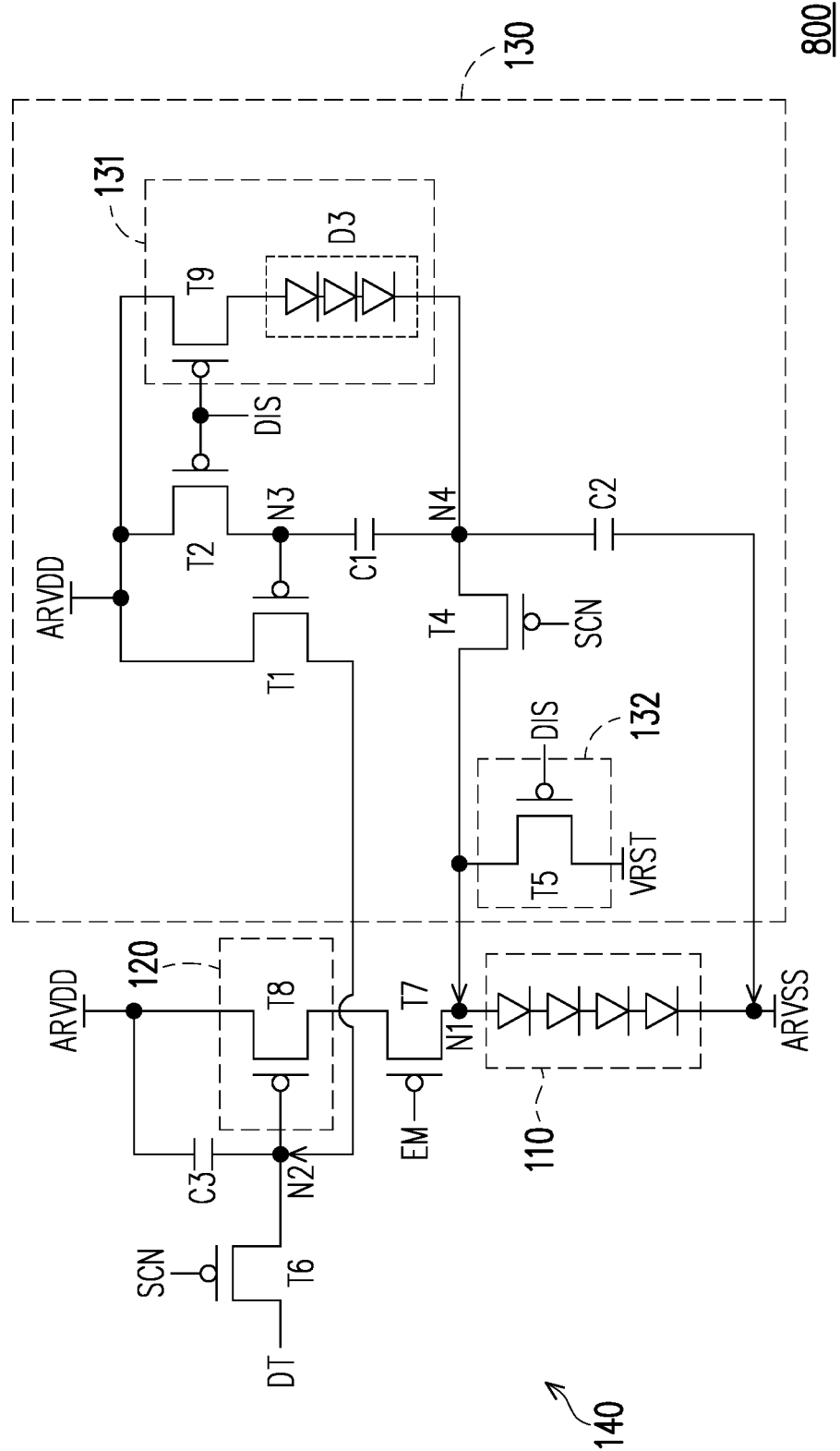
FIG. 12 is a schematic circuit diagram of a driver circuit according to yet another embodiment of the disclosure.

FIG. 12 is a schematic circuit diagram of a driver circuit 800 according to yet another embodiment of the disclosure.

The driver circuit 800 shown in FIG. 12 can be used as an implementation example of the driver circuit 100 shown in FIG. 1. In the embodiment shown in FIG. 12, the driver circuit 800 includes the pixel circuit 140 and the detection and protection circuit 130. The implementation of the pixel circuit 140 may be referred to the related description of the pixel circuit 140 shown in FIG. 4, and therefore will not be repeated in the following. The difference from the embodiment shown in FIG. 4 is that, according to actual requirements, the reset circuit 131 shown in FIG. 12 may include the transistor T9 and/or one or more diodes D3 (e.g., three in this embodiment) connected in series. In detail, the first end of the transistor T9 may receive the first voltage ARVDD, the second end of the transistor T9 may be electrically connected to one end (e.g., the anode end) of the one or more diodes D3, and an other end (e.g., the cathode end) of the one or more diodes D3 may be electrically connected to the fourth node N4, and the control end of the transistor T9 may receive the reset signal DIS. In some embodiments, the one or more diodes D3 may be implemented by transistors, and this embodiment is not limited thereto. The details of the operation and waveforms of the driver circuit 800 shown in FIG. 12 in the situation where the electronic unit 110 is in normal operation or at least any one of multiple light emitting units is short-circuited or damaged can be analogously derived from the relevant descriptions of the embodiments shown in FIG. 11 and FIG. 5, and therefore will not be repeated in the following.

To sum up, the driving device and the driving method thereof according to the embodiments of the disclosure may be provided with the detection and protection circuit 130 electrically connected to the electronic unit 110 and the driver unit 120 through the first node N1 and the second node N2, respectively. When the voltage of the first node N1 is pulled down, the detection and protection circuit 130 may control the driver unit 120 to be turned off. According to some embodiments, during the reset period TR, the detection and protection circuit 130 may supply the reset voltage VRST to the first node N1, and during the scanning period TS, the detection and protection circuit 130 may detect the voltage of the first node N1. According to some embodiments, the driver circuit of the disclosure may stop power supply to the electronic unit 110 when the electronic unit 110 is short-circuited or damaged, thereby protecting the electronic unit 110 from excessive current.

Finally, it should be noted that the above embodiments are only used to illustrate the technical solutions of the disclosure, but not to limit them; although the disclosure has been described in detail with reference to the foregoing embodiments, those of ordinary skill in the art should understand that the technical solutions described in the foregoing embodiments can still be modified, or some or all of the technical features thereof can be equivalently replaced; however, such modifications or substitutions do not make the essence of the corresponding technical solutions deviate from the scope of the technical solutions of the embodiments of the disclosure. In addition, the features among the embodiments can be arbitrarily mixed and matched as long as they do not violate the spirit of the invention or conflict with each other.

What is claimed is:

1. An electronic device comprising a driver circuit, the driver circuit comprising:
    an electronic unit;
    a driver unit electrically connected to the electronic unit; and
    a detection and protection circuit electrically connected to the electronic unit through a first node, and electrically connected to a gate terminal of the driver unit through a second node,
    wherein when a voltage of the first node is pulled down, the detection and protection circuit is configured to control the driver unit to be turned off,
    wherein the detection and protection circuit comprises:
        a first transistor electrically connected to the second node, wherein the first transistor is configured to supply a first voltage to the second node to turn off the driver unit.

2. The electronic device according to claim 1, wherein the detection and protection circuit further comprises:
    a first capacitor, wherein the first capacitor has a third node at one end, and the third node is electrically connected to a gate terminal of the first transistor.

3. The electronic device according to claim 2, wherein the detection and protection circuit further comprises:
    a second capacitor, wherein one end of the second capacitor is electrically connected to an other end of the first capacitor, and an other end of the second capacitor receives a second voltage.

4. The electronic device according to claim 2, wherein the detection and protection circuit further comprises:
    a second transistor electrically connected to the third node, wherein the second transistor is configured to supply the first voltage to the third node during a reset period.

5. The electronic device according to claim 4, wherein the detection and protection circuit further comprises:
    a third capacitor, wherein one end of the third capacitor is electrically connected to the third node, and an other end of the third capacitor receives the first voltage.

6. The electronic device according to claim 2, wherein the detection and protection circuit further comprises:
    a third transistor electrically connected to the first node, wherein the third transistor is configured to turn on the first node and an other end of the first capacitor during a detection period or a scanning period.

7. The electronic device according to claim 6, wherein the detection and protection circuit further comprises:
    a resistor electrically connected to the third transistor and the other end of the first capacitor.

8. The electronic device according to claim 2, wherein the detection and protection circuit further comprises:
    a reset unit electrically connected to an other end of the first capacitor, wherein the reset unit is configured to supply a reset voltage or the first voltage to the other end of the first capacitor during a reset period.

9. The electronic device according to claim 2, wherein the detection and protection circuit further comprises:
    a reset unit electrically connected to the first node, wherein the reset unit is configured to supply a reset voltage or a reference voltage to the first node during a reset period.

10. The electronic device according to claim 2, wherein the detection and protection circuit further comprises:
    a diode, wherein one end of the diode is electrically connected to the third node.

11. The electronic device according to claim 10, wherein the detection and protection circuit further comprises:
    a third transistor electrically connected to the first node, wherein the third transistor is configured to turn on the first node and an other end of the diode during a scanning period.

12. The electronic device according to claim 1, wherein the driver unit is electrically connected to a switch unit through the second node, the driver unit is electrically connected to the first node through a control unit, wherein the switch unit is configured to supply a data voltage to the second node during a scanning period, and the control unit is configured to shut down during a data writing period to stop power supply to the first node.

13. The electronic device according to claim 1, wherein the electronic unit comprises a light emitting unit.

14. A driving method of a driver circuit, the driver circuit comprising an electronic unit, a driver unit, and a detection and protection circuit, wherein the driver unit is electrically connected to the electronic unit, the detection and protection circuit is electrically connected to the electronic unit through a first node, and is electrically connected to a gate terminal of the driver unit through a second node, and the driving method comprises:
   supplying a reset voltage to the first node during a reset period through the detection and protection circuit;
   detecting a voltage of the first node during a scanning period through the detection and protection circuit; and
   when the voltage of the first node is pulled down, turning off the driver unit through the detection and protection circuit.

15. The driving method according to claim 14, wherein the detection and protection circuit comprises a first transistor electrically connected to the second node, and the driving method further comprises:
   when the voltage of the first node is pulled down, supplying a first voltage to the second node through the first transistor to turn off the driver unit.

16. The driving method according to claim 15, wherein the detection and protection circuit further comprises a first capacitor, the first capacitor has a third node at one end, and the third node is electrically connected to a gate terminal of the first transistor.

17. The driving method according to claim 16, wherein the detection and protection circuit further comprises a second transistor electrically connected to the third node, and the driving method further comprises:
   supplying the first voltage to the third node during the reset period through the second transistor.

18. The driving method according to claim 16, wherein the detection and protection circuit further comprises a third transistor electrically connected to the first node, and the driving method further comprises:
   turning on the first node and an other end of the first capacitor during a detection period or a scanning period through the third transistor.

19. The driving method according to claim 14, wherein the driver unit is electrically connected to a switch unit through the second node, the driver unit is electrically connected to the first node through a control unit, and the driving method further comprises:
   supplying a data voltage to the second node during the scanning period through the switch unit; and
   shutting down the control unit during a data writing period to stop power supply to the first node.

* * * * *